United States Patent [19]

Väisänen et al.

[11] Patent Number: 5,118,965
[45] Date of Patent: Jun. 2, 1992

[54] ANALOG PULSE CONVERTER FROM SQUARE TO TRIANGULAR TO $COS^2$ WAVE

[75] Inventors: Risto Väisänen; Jukka Sarasmo; Vesa Pekkarinen, all of Salo, Finland

[73] Assignee: Nokia Mobile Phones Ltd., Salo, Finland

[21] Appl. No.: 490,159

[22] Filed: Mar. 7, 1990

[30] Foreign Application Priority Data

Mar. 29, 1989 [FI] Finland ................................. 891512

[51] Int. Cl.$^5$ ........................ H03K 5/22; H03K 5/156
[52] U.S. Cl. .................................... 307/261; 307/268; 307/263; 328/22; 328/36
[58] Field of Search ............... 307/261, 268, 228, 260, 307/263, 270, 490; 328/13, 22, 127, 181, 54, 185, 74, 27, 136, 34, 139, 35–36, 144, 196, 183; 330/288

[56] References Cited

U.S. PATENT DOCUMENTS

| | | | |
|---|---|---|---|
| 3,078,416 | 2/1963 | McAuliffe | 328/36 |
| 3,139,537 | 12/1960 | Secretan | 328/27 |
| 3,459,964 | 8/1969 | Yoshida et al. | 328/34 |
| 3,599,013 | 8/1971 | Cope | 328/144 |
| 3,676,698 | 7/1972 | Hunter | 328/183 |
| 3,821,652 | 6/1974 | Wiebe et al. | 328/27 |
| 3,839,679 | 10/1974 | Hughes | 307/228 |
| 3,868,519 | 2/1975 | Green | 307/268 |
| 3,982,189 | 9/1976 | Brooks et al. | 328/27 |
| 4,019,118 | 4/1977 | Harwood | 328/144 |
| 4,228,366 | 10/1980 | Huttemann et al. | 307/261 |
| 4,311,921 | 1/1982 | Dayton | 307/261 |
| 4,355,243 | 10/1982 | Tellert | 328/27 |
| 4,356,410 | 10/1982 | Miskin | 307/228 |
| 4,393,314 | 7/1983 | Kunze | 328/181 |
| 4,395,642 | 7/1983 | Traub | 328/27 |
| 4,413,237 | 11/1983 | Baba | 307/228 |
| 4,415,869 | 11/1983 | Duijkers | 328/185 |
| 4,536,662 | 8/1985 | Fujii | 330/288 |
| 4,651,025 | 3/1987 | Smeulers | 328/181 |

FOREIGN PATENT DOCUMENTS 1406749 6/1988 U.S.S.R. .......................... 307/268

Primary Examiner—Stanley D. Miller
Assistant Examiner—Toan Tran
Attorney, Agent, or Firm—Darby & Darby

[57] ABSTRACT

The invention relates to the forming of a control pulse for the transmitter in a GSM radio telephone system. A $cos^2$ pulse is formed by means of an analog circuit from a rectangular pulse which is first shaped into a triangular pulse which may be somewhat clipped at its peak. The triangular pulse is further shaped into a $cos^2$ pulse. The circuit also includes the selection of the abruptness of the triangular pulse and, thereby, the abruptness of the $cos^2$ pulse.

9 Claims, 2 Drawing Sheets

ANALOG PULSE CONVERTER FROM SQUARE TO TRIANGULAR TO COS² WAVE

BACKGROUND OF THE INVENTION

The invention relates to an analog electronic circuit which shapes a rectangular pulse into a cos² pulse having a variable time constant.

New devices and systems require a control pulse having a precisely defined form. This form is achieved by shaping an initial pulse into the desired pulse form via a shaping circuit. It is known to solve the defined problem by using a digital technique, in which all initial pulse can be shaped digitally with relative ease and then converted by a D/A converter into an analog pulse of the desired form. However, a digitally shaped pulse has the disadvantage that the curtain curve of the initial pulse is stepped, which is due to the limited number of bits of the D/A converter. The step-wise quality due to the quantization of the pulse for its part causes problems in a digital GSM system, where the power of a radio telephone is controlled by means of a digitally shaped pulse. A pulse of this type causes a widening of the power spectrum. In addition, a digital pulse shaper requires digital control.

SUMMARY OF THE INVENTION

The task is thus to provide an electronic circuit producing a pulse with a curtain curve which is not stepped and simple to implement. This task is solved by having the pulse shaper comprise a first means, which shapes a rectangular pulse arriving at the input of the pulse shaper into a triangular pulse; a second means, which shapes the triangular pulse into a cos² pulse; and a third means, which varies the abruptness of the triangular pulse.

According to the present invention, a rectangular wave supplied to the input of the circuit is converted to a triangular wave by means of resistors, a capacitor, and transistors. The leading edge and the trailing edge of the rectangular wave serve as triggers, causing the capacitor to charge and discharge with a constant current, thus forming a triangular pulse. Depending on the pulse length of the rectangular wave, the triangular pulse may be whole or clipped at its peak. Furthermore, by means of a number of transistors, the triangular pulse is shaped into a cos² pulse. In addition, the circuit includes an arrangement by means of which additional capacitors can be switched in parallel with the above-mentioned capacitor, whereupon the time constant of the capacitor can be varied. N additional switchable capacitors make $2^N$ time constants possible.

BRIEF DESCRIPTION OF THE DRAWINGS

The circuit according to the invention is described below in detail with reference to the accompanying figures, in which.

DETAILED DESCRIPTION OF THE PREFERRED EMBODIMENT

Figure 1:
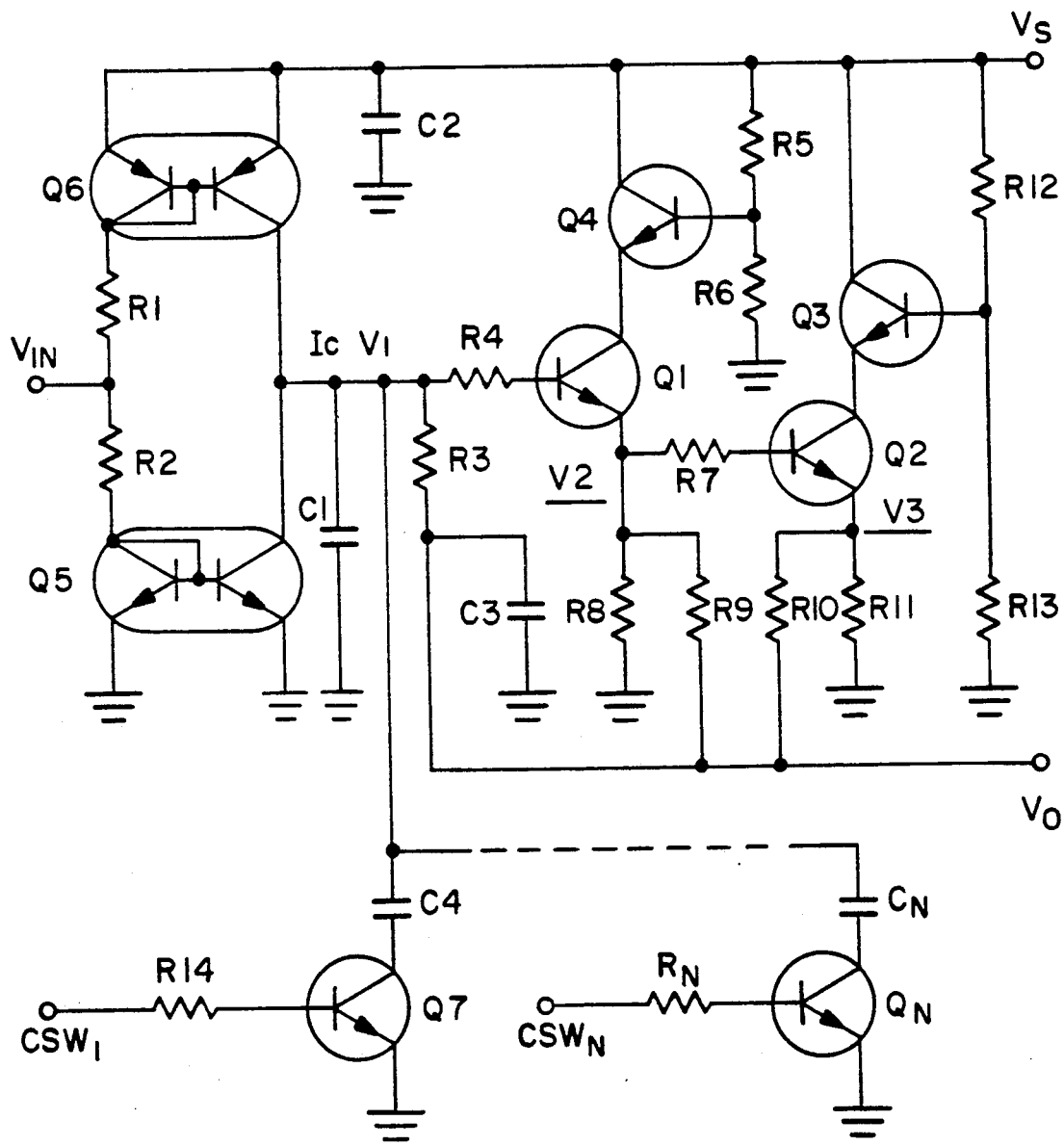
FIG. 1 depicts the implementation of one circuit according to the invention.

In the circuit of FIG. 1, the incoming pulse Vin is shaped into a triangular voltage appearing across the capacitor C1 by means of transistors Q5, Q6 and capacitor C1. From this triangular voltage there is further obtained a shaped output voltage Vo by means of transistors Q1-Q4 and resistors R3, R9 and R10. Capacitors C4 . . . CN can be switched in or at of the circuit under the control of transistors Q7 . . . QN which serve as switches in parallel with capacitor C1.

The operation of the shaping circuit is as follows: a rectangular wave Vin is formed from the supply voltage Vs by chopping it into inverted pulses of the desired length, a pulse being considered to be the time interval during which the voltage is 0 V. Of course, a rectangular wave can also be formed in other known ways. Transistors Q5 and Q6 function as current mirrors. At the descending edge of the incoming pulse (when the voltage drops from Vs to 0 V) transistor Q6 becomes conductive and current flows through the transistor part connected as the diode. Because of the connection the same current passes through the other transistor part of transistor Q6 that is connected as a transistor. This current Ic charges capacitor C1. The intensity of the charging current is:

$$Ic = \frac{Vs - 0.6 \text{ v}}{R1}$$

The time constant T1 of the charging of capacitor C1 is:

$$T1 = \frac{C1 \times Vs}{Ic}$$

The time constant depends on the value of C1. As was stated above, capacitors C4 . . . CN can be switched in parallel with capacitor C1 by means of control lines Csw1 . . . N, in which case the time constant and thereby the rising rate of the capacitor charging voltage can be varied.

Figure 2:
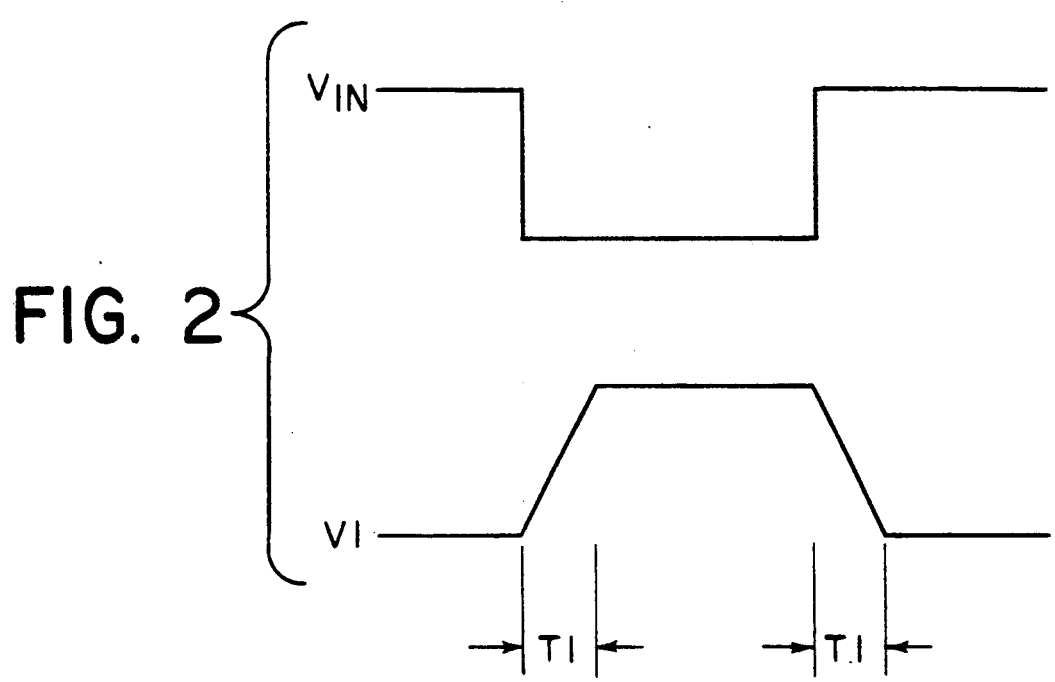
FIG. 2 depicts the temporal relation of the rectangular wave arriving at the circuit and the capacitor voltage.

In a corresponding manner, at the rising edge of the rectangular wave Vin (the voltage rises from 0 V to Vs), transistor Q5 becomes conductive and capacitor C1 discharges with a constant current. If R1=R2, the intensity of the current is the same as that of the charging current. Thus the gradual-edged waveform (V1) shown in FIG. 2 is formed. FIG. 2 shows how the voltage V1 across capacitor C1 rises after time constant T1 to a value close to Vs and respectively drops within the same time to 0 V, when the rising and descending edges of the rectangular wave function as triggers. If the rectangular pulse is short, a triangular pulse is obtained from the voltage V1, and when the pulse is long, a pulse with a clipped peak is respectively obtained. The abruptness of the pulse is affected by means of capacitor C1.

Further referring to FIG. 1, it is observed that when the rising voltage across the capacitor reaches the base-emitter voltage 0.6 V of transistor Q1, this transistor becomes conductive and thus the emitter voltage V2 begins to rise. When this voltage has reached the basee-mitter voltage 0.6 V of transistor Q2, the emitter voltage V3 begins to rise. The voltages V1, V2 and V3 are summed by means of resistors R3, R9 and R10 as the initial voltage Vo of the circuit, the voltage having the shape of a cos² pulse. The equation:

$$Vo = \left( \frac{V1}{R3} + \frac{V2}{R9} + \frac{V3}{R10} \right) \times \left( \frac{1}{1/R3 + 1/R9 + 1/R10} \right)$$

defines the voltage Vo.

The voltage is a function of time, since V1, V2 and V3 are functions of time.

Figure 3:
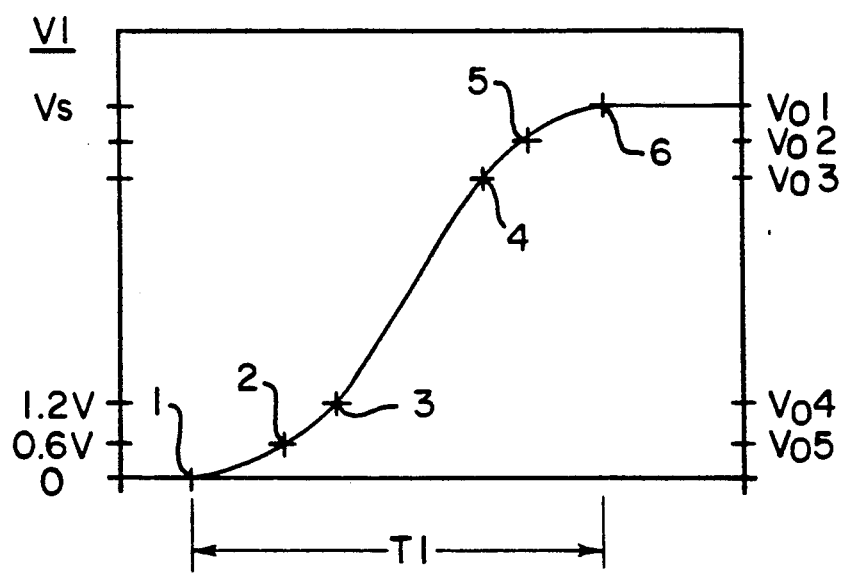
FIG. 3 depicts as a function of time the output voltage formed by the circuit.

FIG. 3 shows the form of the initial voltage Vo of the circuit as a function of time. The form of the initial voltage is easy to understand starting from a situation in which the descending edge of an inverted rectangular wave causes a linear growth of the charging voltage of capacitor C1. In this case, from angle point 1 to point 2, V2 and V3 are zero and V1 rises to 0.6 V, which it reaches at angle point 2.

At angle point 2, V2=0 and V3=0 and V1=0.6 V.

At angle point 3, V2=0.6 V and V3=0 V and V1=1.2 V.

From angle point 4 onward, V3 is constant, i.e.

$$V3 = \frac{R13}{R12 + R13} \times Vs$$

At angle point 4

$$V1 = \frac{R13}{R12 + R13} \times Vs + 0.6 \text{ V} + \frac{V3}{R11 \times h_{FE}} \times R7 + \frac{I2}{R8 \times h_{FE}} \times R8$$

$h_{FE}$=direct-current amplification of transistors Q1 and Q2.

From angle point 5 onward, V2 is constant $$V2 = R6/(R5+R6) \times Vs - 0.6 V$$

and $$V1 = \frac{R6}{R5 + R6} \times Vs + 0.6 \text{ V} + \frac{I2}{R8 \times h_{FE}} \times R4$$

The first half of the initial pulse Vo is formed in this manner. The other half is formed as its mirror, when capacitor C1 begins to discharge at the rising edge of the incoming pulse Vin.

In theory the formed cos² pulse has acute angles at the angle points, but in practice, owing to the characteristic curves of the transistors and to capacitor C3, the angle points are rounded, whereby a cos² signal of a good quality is obtained.

The described pulse-shaper circuit according to the invention has many advantages over the prior art circuits implemented by using the digital technique. There are no quantization steps, and no digital control is needed. The circuit does not produce quantization noise, which is a considerable advantage considering the use of the circuit. The circuit is of simple construction and contains few components, and it is easy and inexpensive to integrate as an IC circuit.

The pulse-shaper circuit according to the invention is in particular intended for forming a control pulse for the transmitter of a mobile radio telephone or a ground station in a GSM system, although it can, of course, be used for forming a control pulses for any device.

What is claimed is:

1. An analog pulse shaper which shapes a rectangular pulse into a cos² pulse, characterized in that the pulse shaper comprises:

a) a first means which receives a rectangular pulse and shapes the rectangular pulse into a triangular pulse with rising and falling sides, said triangular pulse may have a clipped peak, said first means comprising a capacitor, first current mirror, and a second current mirror, each of said first and second current mirrors being connected to an input terminal of said pulse shaper and to said capacitor, said capacitor being charged with a first constant current from said first current mirror when the rectangular pulse voltage is low and said capacitor being discharged by said second current mirror with a second constant current when the rectangular pulse voltage is high, said triangular pulse being voltage across said capacitor;

b) a second means which receives the triangular pulse formed by the first means and shapes the triangular pulse into a cos² pulse by changing the slopes of the rising and falling sides at break points and summing said changed slopes so as to approximate a cos² shape; and c) output means for delivering the cos² pulse to an output terminal of the pulse shaper.

2. The pulse shaper of claim 1, wherein the first constant current is determined by a voltage difference between a supply voltage and the rectangular pulse, when its voltage is low, the first current mirror, and a first input resistor.

3. The pulse shaper of claim 1, wherein the second constant current is determined by a voltage difference between a ground potential and the rectangular pulse, when its voltage is high, the second current mirror, and a second input resistor.

4. The pulse shaper of claim 1, wherein the slopes of the sides of the triangular pulse formed by the first means are variable.

5. The analog pulse shaper of claim 1, characterized in that the second means comprises:

transistors with their peripheral components, coupled so that the voltage of the capacitor is the base voltage of a first transistor, and the emitter voltage of the first transistor is the base voltage of a second transistor and the threshold voltage of the first and second transistors establish break points of the cos² pulse; and summing means for summing the voltage across the capacitor and the first and second current mirrors to obtain the cos² pulse.

6. The analog pulse shaper of claim 5, wherein said summing means includes:

a first summing resistor coupled between the pulse shaper output and the capacitor;

a second summing resistor coupled between the pulse shaper output and the emitter of the first transistor; and a third summing resistor coupled between the pulse shaper output and the emitter of the second transistor;

said summing resistors summing the voltage (V1) of the capacitor, the emitter voltage (V2) of the first transistor, and the emitter voltage (V3) of the second transistor output voltage pulse (Vo) according to the equation:

$$Vo = \left( \frac{V1}{R3} + \frac{V2}{R9} + \frac{V13}{R10} \right) \times \left( \frac{1}{1/R3 + 1/R9 + 1/R10} \right)$$

7. The analog pulse shaper of claim 4; characterized in that the slope of the sides of the triangular pulse is made variable by a third means connected in parallel with the capacitor of the first means, said third means permitting selectable switching of N additional capacitors, whereby $2^N$ time constants may be selected.

8. An analog pulse shaper which shapes a triangular pulse effective across a capacitor into a $\cos^2$ pulse, characterized in that the pulse shaper comprises:
   a) two transistors connected with the capacitor, and coupled so that the voltage of the capacitor is the base voltage of a first one of the transistors, and the emitter voltage of the first transistor is the base voltage of a second one of the transistors, and the threshold voltages of the transistors determine break points in the slope of the signal to approximate a $\cos^2$ pulse;
   b) means for summing a voltage (V1) of the capacitor, a first transistor emitter voltage (V2), and a second transistor emitter voltage (V3), said summing means providing a $\cos^2$ pulse; and
   at an output terminal of said pulse shaper.

9. The analog pulse shaper of claim 8, wherein said means for summing includes:
   a first summing resistor is coupled between the pulse shaper output and the capacitor;
   a second summing resistor is coupled between the pulse shaper output and the first transistor's emitter; and
   a third summing resistor is coupled between the pulse shaper output and the second transistor's emitter;
   said summing resistors summing the voltage (V1) of the capacitor, the emitter voltage (V2) of the first transistor, and the emitter voltage (V3) of the second transistor into an output voltage pulse (Vo) according to the equation:

$$Vo = \left( \frac{V1}{R3} + \frac{V2}{R9} + \frac{V3}{R10} \right) \times \left( \frac{1}{1/R3 + 1/R9 + 1/R10} \right).$$

* * * * *